US012785040B2

(12) United States Patent
Lee et al.

(10) Patent No.: US 12,785,040 B2
(45) Date of Patent: Nov. 3, 2026

(54) SUBSTRATE PROCESSING APPARATUS

(71) Applicant: Samsung Electronics Co., Ltd., Suwon-si (KR)

(72) Inventors: Kyung Min Lee, Suwon-si (KR); Myung Jae Yoo, Suwon-si (KR); Sung-Yeol Kim, Suwon-si (KR); Sang Yeol Park, Suwon-si (KR); Sung Yong Lim, Suwon-si (KR); Eun Suk Lim, Suwon-si (KR); Min Ju Jeong, Suwon-si (KR); Yong Won Cho, Suwon-si (KR)

(73) Assignees: Samsung Electronics Co., Ltd., Gyeonggi-do (KR); New Power Plasma Co., Ltd., Gyeonggi-do (KR)

( * ) Notice: Subject to any disclaimer, the term of this patent is extended or adjusted under 35 U.S.C. 154(b) by 295 days.

(21) Appl. No.: 18/599,825

(22) Filed: Mar. 8, 2024

(65) Prior Publication Data

US 2024/0312765 A1 Sep. 19, 2024

(30) Foreign Application Priority Data

Mar. 16, 2023 (KR) ........................ 10-2023-0034554

(51) Int. Cl.
*H01J 37/32* (2006.01)

(52) U.S. Cl.
CPC .... *H01J 37/32183* (2013.01); *H01J 37/3299* (2013.01); *H01J 2237/24564* (2013.01)

(58) Field of Classification Search
CPC ............. H01J 37/32183; H01J 37/3299; H01J 2237/24564; H01J 37/32174; H01J 37/32146; H01J 2237/334; H01J 37/32935; H01J 37/32926; H01J 37/32917; H01J 37/32715; H01J 37/32155;
(Continued)

(56) References Cited

U.S. PATENT DOCUMENTS 9,294,100 B2 3/2016 Van Zyl
9,934,947 B2 * 4/2018 Kubota ............. H01J 37/32174
(Continued)

FOREIGN PATENT DOCUMENTS

JP 2001-007089 A 1/2001
KR 2014-0071347 A 6/2014
(Continued)

*Primary Examiner* — Renan Luque
(74) *Attorney, Agent, or Firm* — Harness, Dickey & Pierce, P.L.C.

(57) ABSTRACT

A substrate processing apparatus including the controller are provided. The controller includes: a signal analyzer configured to detect at least one of an amplitude, phase, and frequency of a first signal, which is provided to a chamber; a radio frequency (RF) signal generator configured to generate an RF signal with a natural frequency based on a power of the first signal; a harmonic controller configured to generate a second signal based on the power of the first signal and at least one of the amplitude, phase, and frequency of the first signal, the second signal having a different amplitude, a different phase, and/or a different frequency from the RF signal; an operator configured to perform an operation on the RF signal and the second signal; and a filter configured to generate an RF control signal by filtering an output signal of the operator.

20 Claims, 16 Drawing Sheets

(58) Field of Classification Search
CPC ........... H01J 37/32091; H01J 37/32082; H01J 37/32055; H01J 2237/327; H10P 72/0421; H05H 1/46; H03L 7/26; H03L 1/00; H03F 3/24; H03F 3/189; H03F 1/56; H02M 7/5387; G04F 5/14
See application file for complete search history.

(56) References Cited

U.S. PATENT DOCUMENTS

| | | | | |
|---|---|---|---|---|
| 10,903,048 | B2 | 1/2021 | Wu et al. | |
| 11,282,678 | B2 | 3/2022 | Na et al. | |
| 11,282,679 | B2 | 3/2022 | Na et al. | |
| 2015/0276833 | A1 | 10/2015 | Scullin et al. | |
| 2022/0367149 | A1* | 11/2022 | Funk | H01J 37/32146 |
| 2024/0087850 | A1* | 3/2024 | Burry | H01J 37/32183 |

FOREIGN PATENT DOCUMENTS

| | | | |
|---|---|---|---|
| KR | 2015-0095760 | A | 8/2015 |
| KR | 2015-0096427 | A | 8/2015 |
| KR | 2018-0081682 | A | 7/2018 |
| KR | 2019-0037358 | A | 4/2019 |
| KR | 2019-0093209 | A | 8/2019 |
| KR | 2019-0140488 | A | 12/2019 |
| KR | 2020-0003244 | A | 1/2020 |
| KR | 2020-0018662 | A | 2/2020 |
| KR | 2020-0051834 | A | 5/2020 |
| KR | 2020-0055068 | A | 5/2020 |
| KR | 2020-0066684 | A | 6/2020 |
| KR | 2020-0067869 | A | 6/2020 |
| KR | 2020-0103118 | A | 9/2020 |
| KR | 10-2175086 | B1 | 11/2020 |
| KR | 2020-0125985 | A | 11/2020 |
| KR | 2021-0007973 | A | 1/2021 |
| WO | 2022/144080 | A1 | 7/2022 |

* cited by examiner

1000B

1000D

1000E

SUBSTRATE PROCESSING APPARATUS

CROSS-REFERENCE TO RELATED APPLICATION

This application claims priority from Korean Patent Application No. 10-2023-0034554 filed on Mar. 16, 2023 in the Korean Intellectual Property Office, and all the benefits accruing therefrom under 35 U.S.C. 119, the contents of which in its entirety are herein incorporated by reference.

BACKGROUND

The inventive concepts relate to controllers with an improved efficiency and substrate processing apparatus including the same.

Plasma is widely used in processes of fabricating a semiconductor device, a plasma display panel (PDP), a liquid crystal display (LCD), a solar cell, and the like. Examples of processes using plasma include dry etching, dry cleaning, plasma enhanced chemical vapor deposition (PECVD), sputtering, and ashing. Generally, capacitively coupled plasma (CCP), inductively coupled plasma (ICP), the mixture of CCP and ICP, helicon plasma, microwave plasma, and the like are used in such processes using plasma.

There has been a trend to supply power for generating plasma to equipment (particularly, etchers) with the use of high-output high-frequency waves for a sufficient plasma density. For example, a radio frequency (RF) capacitive coupled plasma (CCP) source or an inductively-coupled plasma (ICP) source in the form of electromagnetic waves having a predetermined frequency and intensity may be used as a plasma source.

When using high-output high-frequency waves as a plasma source, not only natural frequency signals, which are involved in the generation of plasma, but also harmonic components may be generated. However, data shows that such harmonic components may adversely affect the performance and results of plasma processes by affecting the uniformity of plasma in chambers. Therefore, research is now underway into how to remove harmonic components generated in a chamber or to improve the performance of plasma processes using harmonic components.

SUMMARY

The inventive concepts provide controllers with improved efficiency.

The inventive concepts also provide substrate processing apparatus with improved efficiency.

However, aspects of inventive concepts are not restricted to those set forth herein. The above and other aspects of the inventive concepts will become more apparent to one of ordinary skill in the art to which the inventive concepts pertain by referencing the detailed description of the present disclosure given below.

According to some example embodiments, there is provided a substrate processing apparatus comprising a signal analyzer configured to detect at least one of an amplitude, phase, and frequency of a first signal, which is provided to a chamber, a radio frequency (RF) signal generator configured to generate an RF signal with a natural frequency based on a power of the first signal, a harmonic controller configured to generate a second signal based on the power of the first signal and at least one of the amplitude, phase, and frequency of the first signal, the second signal having a different amplitude, a different phase, and/or a different frequency from the RF signal, an operator configured to perform an operation on the RF signal and the second signal, and a filter configured to generate an RF control signal by filtering an output signal of the operator.

According to some example embodiments, there is a provided a substrate processing apparatus comprising a chamber in which processes for the substrate are performed, the chamber having processing space therein, a controller configured to generate a radio frequency (RF) control signal, which is for generating plasma in the chamber, an amplifier connected to the controller and configured to amplify the RF control signal, output from the controller, and a matcher connected between the amplifier and the chamber and configured to match an impedance of a signal output from the amplifier and an impedance of the chamber, wherein the controller includes a sensor connected to a node between the matcher and the chamber and configured to sense a voltage and current of a first signal passing through the node, a power detector configured to detect a power of the first signal based on the voltage and current of the first signal, received from the sensor, an RF signal generator configured to generate an RF signal with a natural frequency based on the power of the first signal, and a harmonic control loop configured to control harmonics in the chamber based on the voltage and current of the first signal, received from the sensor.

According to some example embodiments, there is a provided a substrate processing apparatus comprising a chamber in which processes for the substrate are performed, the chamber having processing space therein, a controller configured to generate a radio frequency (RF) control signal, which is for generating plasma in the chamber, an amplifier connected to the controller and configured to amplify the RF control signal, output from the controller, and a matcher connected between the amplifier and the chamber and configured to match an impedance of a signal output from the amplifier and an impedance of the chamber, wherein the controller includes a sensor connected to a node between the matcher and the chamber and configured to sense a voltage and current of a first signal passing through the node, a signal analyzer configured to detect at least one of an amplitude, phase, and frequency of the first signal based on the voltage and current of the first signal, received from the sensor, and the signal analyzer configured to determine which of harmonics generated in the chamber to control, and an RF signal generator configured to receive information of the harmonic to control, from the signal analyzer and generate a distortion signal based on the received information.

It should be noted that the effects of the inventive concepts are not limited to those described above, and other effects of the inventive concepts will be apparent from the following description.

BRIEF DESCRIPTION OF THE DRAWINGS

Example embodiments will be more clearly understood from the following detailed description taken in conjunction with the accompanying drawings in which.

DETAILED DESCRIPTION

Figure 1:
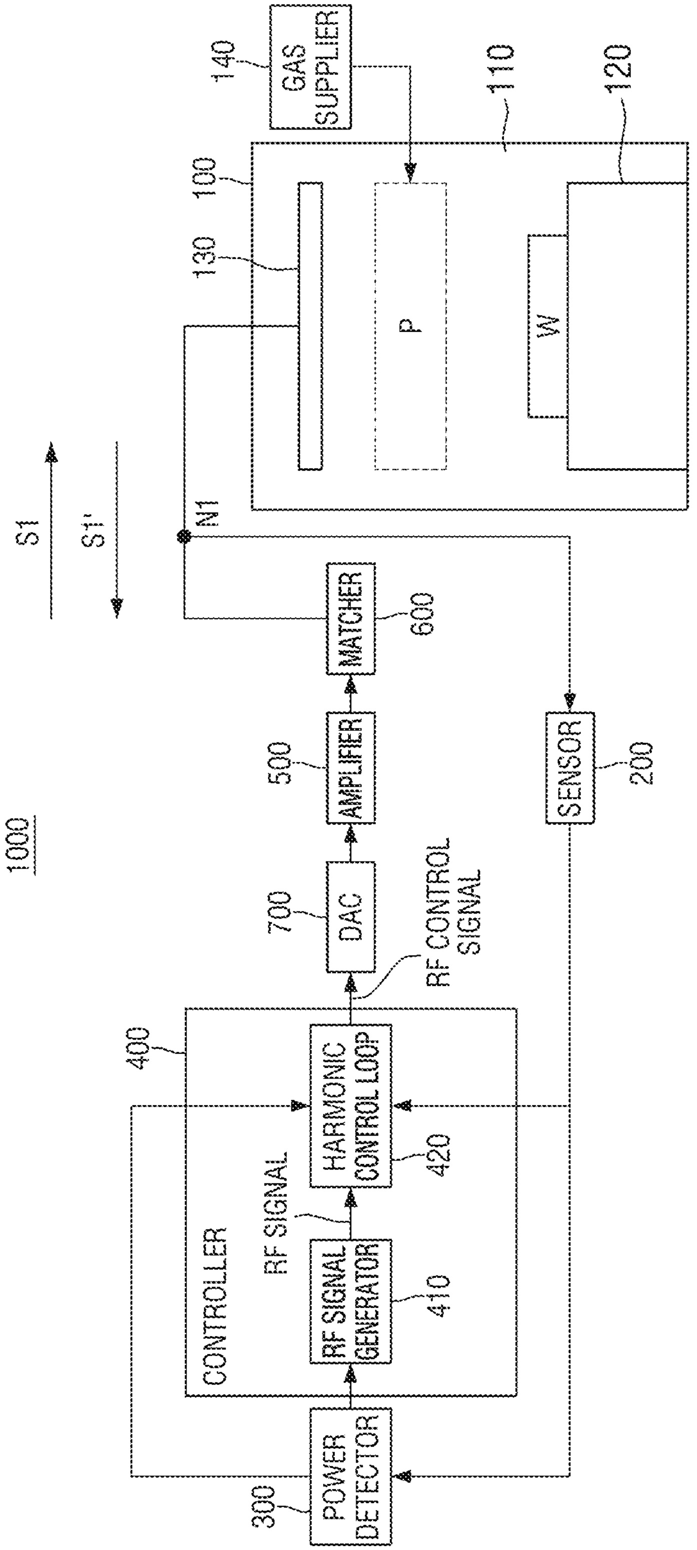
FIG. 1 is a block diagram of a substrate processing apparatus according to some example embodiments.

The present inventive concepts will be described more fully hereinafter with reference to the accompanying drawings, in which some example embodiments of the present inventive concepts are shown. As those skilled in the art would realize, the described example embodiments may be modified in various different ways, all without departing from the spirit or scope of the present inventive concepts.

Accordingly, the drawings and description are to be regarded as illustrative in nature and not restrictive. Like reference numerals designate like elements throughout the specification. The sequence of operations or steps are not limited to the order presented in the claims or figures unless specifically indicated otherwise. The order of operations or steps may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps, and/or operations, these terms are only used to distinguish one element, component, step or operation from another element, component, step, or operation.

Figure 2:
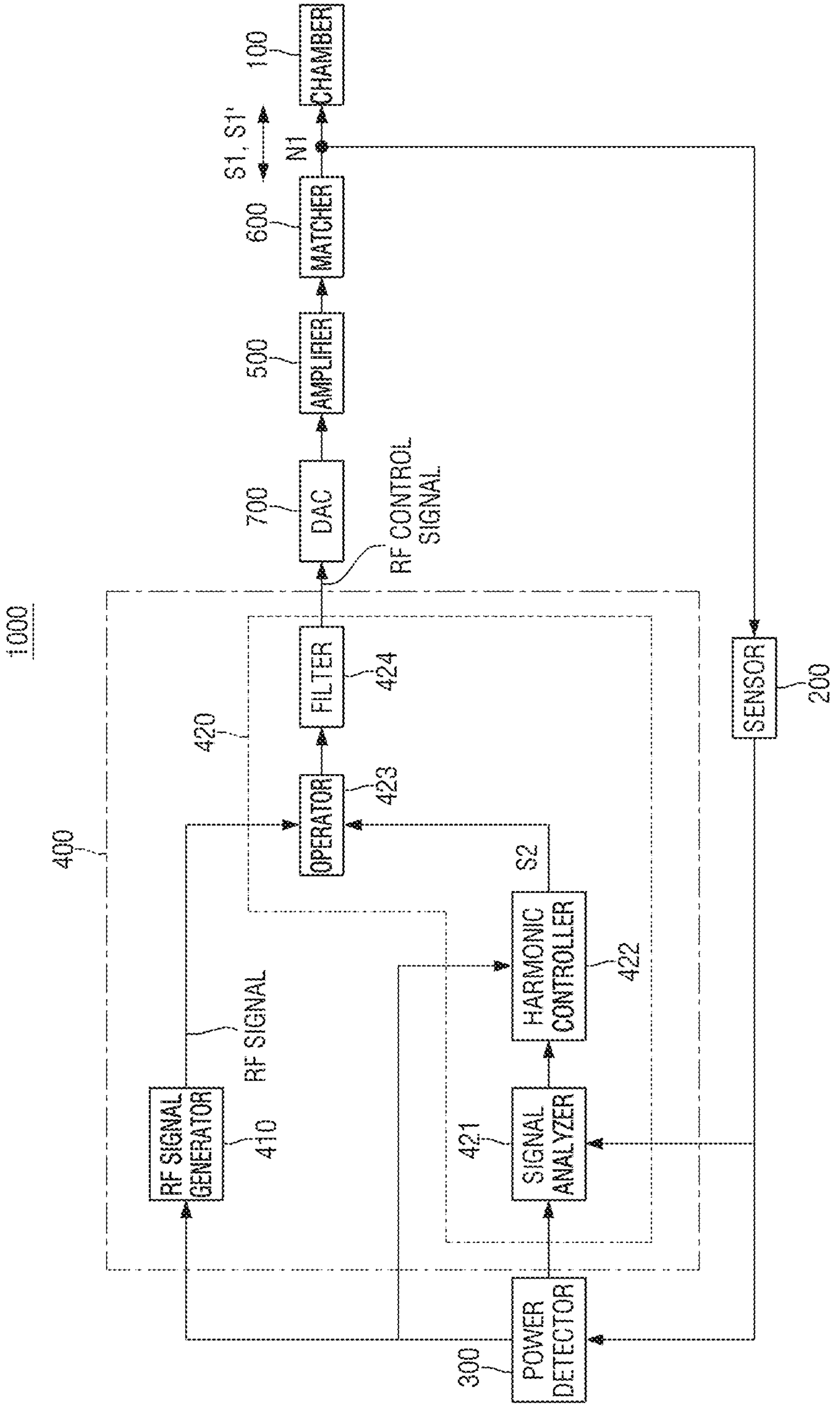
FIG. 2 is a block diagram of the substrate processing apparatus of FIG. 1 according to some example embodiments.

FIG. 1 is a block diagram of a substrate processing apparatus according to some example embodiments. FIG. 2 is a block diagram of the substrate processing apparatus of FIG. 1 according to some example embodiments.

Referring to FIG. 1, a substrate processing apparatus 1000 may include a chamber 100, a sensor 200, a power detector 300, a controller 400, an amplifier 500, and a matcher 600.

In some example embodiments, the chamber 100 may include processing space 110, a substrate W, a support unit 120, an electrode 130, and a plasma area P. Chamber 100 may have the processing space 110 therein for processing the substrate W using plasma to fabricate a semiconductor device. For example, chamber 100 may perform deposition, etching, annealing, and rinsing processes on the substrate W, but example embodiments are not limited thereto. In some example embodiments, the name of the substrate processing apparatus 1000 may vary depending on the function of the chamber 100. For example, the substrate processing apparatus 1000 may also be referred to as a deposition apparatus, an etching apparatus, an annealing apparatus, or a rinsing apparatus depending on the type of process performed in the chamber 100, such as, for example, a deposition, etching, annealing, or rinsing process.

In some example embodiments, the substrate W may refer to the substrate W alone or a stack of the substrate W and at least one predetermined layer or film formed on the surface of the substrate W. In some example embodiments, the surface of the substrate W may refer to the surface of the substrate W or the surface of the predetermined layer or film formed on the substrate of the substrate W. For example, the substrate W may be a substrate or a substrate with at least one material film formed on the substrate W. The material film may be an insulating film and/or a conductive film formed on the substrate by various methods such as deposition, coating, or plating. For example, the insulating film may include an oxide film, a nitride film, or an oxynitride film, and the conductive film may include a metal film or a polysilicon film. In some example embodiments, the material film may be formed on the substrate to have a predetermined pattern.

In some example embodiments, chamber 100 may have an enclosed space having a predetermined size therein. For example, chamber 100 may be formed in various forms in accordance with the shape and size of the substrate W. For example, chamber 100 may have a cylindrical shape corresponding to a disk-shaped substrate W, but the shape of the chamber 100 is not limited thereto. In some example embodiments, chamber 100 may include a conductive member such as an aluminum (Al) member and may be maintained to be electrically grounded to block external noise during a plasma process.

In some example embodiments, the support unit 120 may be installed below chamber 100 and may support the substrate W. For example, the support unit 120 may be an electrostatic chuck supporting the substrate W with an electrostatic force, but example embodiments are not limited thereto. For example, when the support unit 120 is implemented as an electrostatic chuck, the support unit 120 may include a dielectric plate, on which the substrate W is placed, and an electrode, which is installed in the dielectric plate and provides an electrostatic force so that the substrate W is adsorbed onto the dielectric plate.

In some example embodiments, the electrode 130 may be provided as a disk and may be positioned at an upper part of the chamber 100, above the substrate W and the support unit 120. The electrode 130 may be electrically connected to the controller 400 to receive a radio frequency (RF) control signal generated by the controller 400. As will be described later, in some example embodiments, the controller 400 may include an RF power source supplying RF power for generating plasma in the chamber 100. For example, the RF control signal may be a signal having RF power. The electrode 130 may apply the RF power generated by the controller 400 to the inside of the chamber 100 and may thus excite a processing gas in the chamber 100, provided by a gas supplier 140. As the processing gas is excited by the RF power, plasma may be generated in the chamber 100. The plasma area P may be positioned between electrode 130 and the substrate W.

In some example embodiments, the sensor 200 may be connected to a node N1 between the chamber 100 and the matcher 600. The sensor 200 may sense the voltages and currents of signals S1 and S1', which pass through the node N1. In some example embodiments, the sensor 200 may be a voltage-current (VI) sensor, but example embodiments are not limited thereto. In some example embodiments, the sensor 200 may sense both signals S1, which are input from the matcher 600 to the chamber 100, and signals S1', which are input from the matcher 600 to the chamber 100 and then reflected from the chamber 100 to the matcher 600.

In some example embodiments, the sensor 200 may provide information regarding particular signals (hereinafter, the target signals) to be detected and analyzed by a signal analyzer ("421" of FIG. 2) to a harmonic control loop 420, but example embodiments are not limited thereto. For example, the sensor 200 may provide information regarding all the sensed signals S1 and S1' to a power detector 300. For example, the sensor 200 may provide information regarding only the target signals to the power detector 300, but example embodiments are not limited thereto. Alternatively, for example, the sensor 200 may provide information regarding all the sensed signals S1 and S1' to the power detector 300. The structure of the sensor 200, according to some example embodiments, will be described later with reference to FIG. 3.

In some example embodiments, the signal S1, which is provided from the matcher 600 to the chamber 100 through the node N1, may be an RF signal generated by an RF signal generator 410 and finally input to the chamber 100 through the harmonic control loop 420, a digital-to-analog converter (DAC) 700, a amplifier 500, and the matcher 600. The RF signal, which is a signal supplying RF power for generating plasma in the chamber 100, may have a natural frequency. As the RF signal generated by the RF signal generator 410 is provided to the chamber 100 through the amplifier 500, a harmonic signal may be generated in the chamber 100 due to a nonlinear response characteristic of devices that form the amplifier 500 and the matcher 600.

The harmonic signal generated in the chamber 100 may have a frequency of an integer multiple of the natural frequency of the RF signal. For example, if the RF signal has a natural frequency of fc, the harmonic signal may have a frequency of an integer multiple of the natural frequency, e.g., 2fc, 3fc, or 4fc. The harmonic signal generated in the chamber 100 may be a signal generated due to the nonlinearity of a plasma reaction in the chamber 100.

The signal S1', which passes through the node N1 while being reflected from the chamber 100 to the matcher 600, may be a harmonic signal generated due to the nonlinearity of the plasma reaction in the chamber 100. The signal S1' may be an intermodulation signal between a natural frequency signal and a harmonic signal generated in the chamber 100 or may be an intermodulation signal reflected from the chamber 100 to the matcher 600. Also, in some example embodiments, the signal S1' may be a spurious signal generated in the chamber 100 and then reflected from the chamber 100 to the matcher 600.

The power detector 300 may receive the voltages and currents of the signals S1 and S1' from the sensor 200 and may detect the powers of the signals S1 and S1' based on the received voltages and currents. For example, the power detector 300 calculates phase differences between the voltages and currents of the signals S1 and S1', received from the sensor 200, and calculates the powers of the signals S1 and S1' based on the voltages and currents of the signals S1 and S1' and the calculated phase differences. The power detector 300 may provide power information of the signals S1 and S1' to the RF signal generator 410 and the harmonic control loop 420 of the controller 400.

In some example embodiments, the controller 400 may generate an RF control signal for generating plasma in the chamber 100. The controller 400 may include the RF signal generator 410 and the harmonic control loop 420. In some example embodiments, the RF signal generator 410 may include, as a plasma source for generating plasma in the chamber 100, an RF conductively-coupled plasma (CCP) source, an inductively-coupled plasma (ICP) source, or a microwave plasma source in the form of electromagnetic waves having a predetermined frequency and intensity, but example embodiments are not limited thereto. The RF signal generator 410 may generate an RF signal with a natural frequency based on the power information of the signals S1 and S1', received from the power detector 300. The generated RF signal may be a signal supplying RF power for generating plasma in the chamber 100. In some example embodiments, the RF signal generator 410 may generate a digital RF signal.

In some example embodiments, the harmonic control loop 420 may receive the voltages and currents of signals from the sensor 200 and may receive power information of the target signals from the power detector 300. The harmonic control loop 420 may generate an RF control signal controlling the signals generated in the chamber 100, based on the received voltages and currents. In some example embodiments, a signal generated in the chamber 100 to be controlled by the harmonic control loop 420 may be a harmonic signal generated in the chamber 100, an intermodulation signal between a natural frequency signal and a harmonic signal, an intermodulation signal between harmonic signals, or a spurious signal, but example embodiments are not limited thereto. The structure of the harmonic control loop 420 will be described later with reference to FIG. 2.

In some example embodiments, the amplifier 500 may be connected to the controller 400 and may amplify the RF control signal output from the controller 400. In some example embodiments, the DAC 700 may be connected between the controller 400 and the amplifier 500 and may convert digital signals output from the controller 400 into analog signals to be input to the amplifier 400. In some example embodiments, the amplifier 500 may be implemented as a device with a nonlinear response characteristic.

In some example embodiments, the matcher 600 may be connected between the amplifier 500 and the chamber 100 and may match the impedance of signals output from the amplifier 500 and the impedance of the chamber 100. In some example embodiments, the matcher 600 may be implemented as a device with a nonlinear response characteristic.

Referring to FIG. 2, in some example embodiments, the harmonic control loop 420 may include a signal analyzer 421, a harmonic controller 422, an operator 423, and a filter 424. For example, the harmonic control loop 420, the signal analyzer 421, the harmonic controller 422, the operator 423, and the filter 424 may be implemented as processing circuitry or respective processing circuitry such as hardware (e.g., logic circuits) or a combination of hardware and software (e.g., a computer-based electronic system like a processor executing instruction codes or program routines (e.g., a software program)). The instruction codes or the program routines may be stored in any storage device located inside or outside the computer-based electronic system. For example, the signal analyzer 421 may receive the voltages and currents of the signals S1 and S1' from the sensor 200 and may detect the amplitudes, phases, and/or frequencies of the signals S1 and S1' based on the received voltages and currents. The signal analyzer 421 may detect the amplitudes, phases, and/or frequencies of the signals S1 and S1' using fast Fourier transform (FFT), lock-in amplification, or complex signal demodulation (IQ demodulation), but example embodiments are not limited thereto. In some example embodiments, the signal analyzer 421 may detect the impedance of the signals S1 and S1' (e.g., harmonic signals in the chamber 100) at the load of the chamber 100 in real time based on sensing information from the sensor 200, e.g., the voltages and currents of the signals S1 and S1' and the phase differences between the voltages and currents of the signals S1 and S1'. Also, in some example embodiments, the signal analyzer 421 may accurately control the RF control signal, transmitted to the chamber 100, by extracting reflection coefficient information of the components of each of the signals S1 and S1' from the load impedance of the signals S1 and S1'.

In some example embodiments, the signal analyzer 421 may analyze and/or determine one of the signals S1 and S1' as a signal to be controlled, based on detected information. For example, the signal analyzer 421 may receive the voltages and currents of all signals sensed by the sensor 200 (e.g., the signals S1 and S1' passing through the node N1) and may analyze and/or determine which of the signals S1 and S1' to be controlled, based on the received voltages and currents. In some example embodiments, the signal that is determined to be controlled may be a harmonic signal generated in the chamber 100. Thereafter, in some example embodiments, the signal analyzer 421 may provide at least one of the amplitude, phase, and frequency of the signal determined to be controlled to the harmonic controller 422.

In some example embodiments, the harmonic controller 422 may receive power information of the signal determined to be controlled, among other target signals, from the power detector 300. Also, in some example embodiments, the harmonic controller 422 may receive at least one of amplitude information, phase information, and frequency information of the signal determined to be controlled from the signal analyzer 421. The harmonic controller 422 may generate a signal S2 based on the information received from the power detector 300 and the signal analyzer 421. In some example embodiments, the signal S2 generated by the harmonic controller 422 may be a harmonic signal having a frequency of an integer multiple of the natural frequency of RF signals.

In some example embodiments, the harmonic controller 422 may analyze and/or determine the power of the signal S2 based on the information received from the power detector 300 and the power of an RF signal with a natural frequency. The signal S2, which is generated by the harmonic controller 422, may have, for example, a different amplitude, a different phase, and/or a different frequency from the RF signal with the natural frequency. In some example embodiments, the signal S2, which is generated by the harmonic controller 422, may be a signal obtained by converting at least one of the amplitude, phase, and frequency of the signal determined to be controlled, as compared to the signals S1 and S1' sensed by the sensor 200.

In some example embodiments, in order to generate the signal S2, the harmonic controller 422 may sample unit digital data at a faster speed (e.g., at a twice faster speed than) an RF signal with a natural frequency or a harmonic signal sensed by the sensor 200. In some example embodiments, the harmonic controller 422 may implement digital sampling into a chip such as a field programmable gate array (FPGA), a digital signal processor (DSP), a micro-controller unit (MCU), a micro-processor unit (MPU), or a central processing unit (CPU) as logic, firmware, or software to sample the unit digital data. The harmonic controller 422 may use a read-only memory (ROM), a coordinate rotation digital computer (CORDIC), and a multiplication-based structure based on frequency information of a harmonic, received from the signal analyzer 421, to generate the signal S2, which corresponds to a harmonic. The signal S2, which is generated by the harmonic controller 422 according to some example embodiments, will be described later with reference to FIG. 7.

In some example embodiments, the operator 423 may receive an RF signal from the RF signal generator 410 and the signal S2 from the harmonic controller 422 and may perform an operation on the RF signal and the signal S2. For example, the operator 423 may perform an operation such as addition, subtraction, multiplication, or division on the RF signal and the signal S2.

In some example embodiments, the filter 424 may receive, from the operator 423, a signal obtained by performing an operation on the signal S2 and the RF signal generated by the RF signal generator 410, and may generate the RF control signal by performing band-selective filtering on the received signal. In some example embodiments, the filter 424 may be implemented as a digital filter, but example embodiments are not limited thereto. In some example embodiments, the cutoff frequency of the filter 424 may be controlled by controlling the coefficient of the filter 424. For example, the cutoff frequency of the filter 424 may be controlled such that the filter 424 may be able to transmit only signals having a predetermined frequency or higher or lower therethrough. The filter 424 may be configured to be able to transmit the signal S2, which is generated by the harmonic controller 422, therethrough. For example, the filter 424 may filter out all signals except for the signal S2 and the RF signal generated by the RF signal generator 410 and the signal S2. The RF control signal finally output from the filter 424 may be input to the DAC 700.

In this manner, in some example embodiments, various signals generated in the chamber 100, including harmonics, can be dynamically controlled by sensing and analyzing the various signals, generating a signal having a different amplitude, a different phase, and/or a different frequency from the various signals based on the results of the analysis, performing an operation on the generated signal and a signal providing RF power for generating plasma and having a natural frequency, and providing a signal obtained by the operation to the chamber 100.

Figure 3:
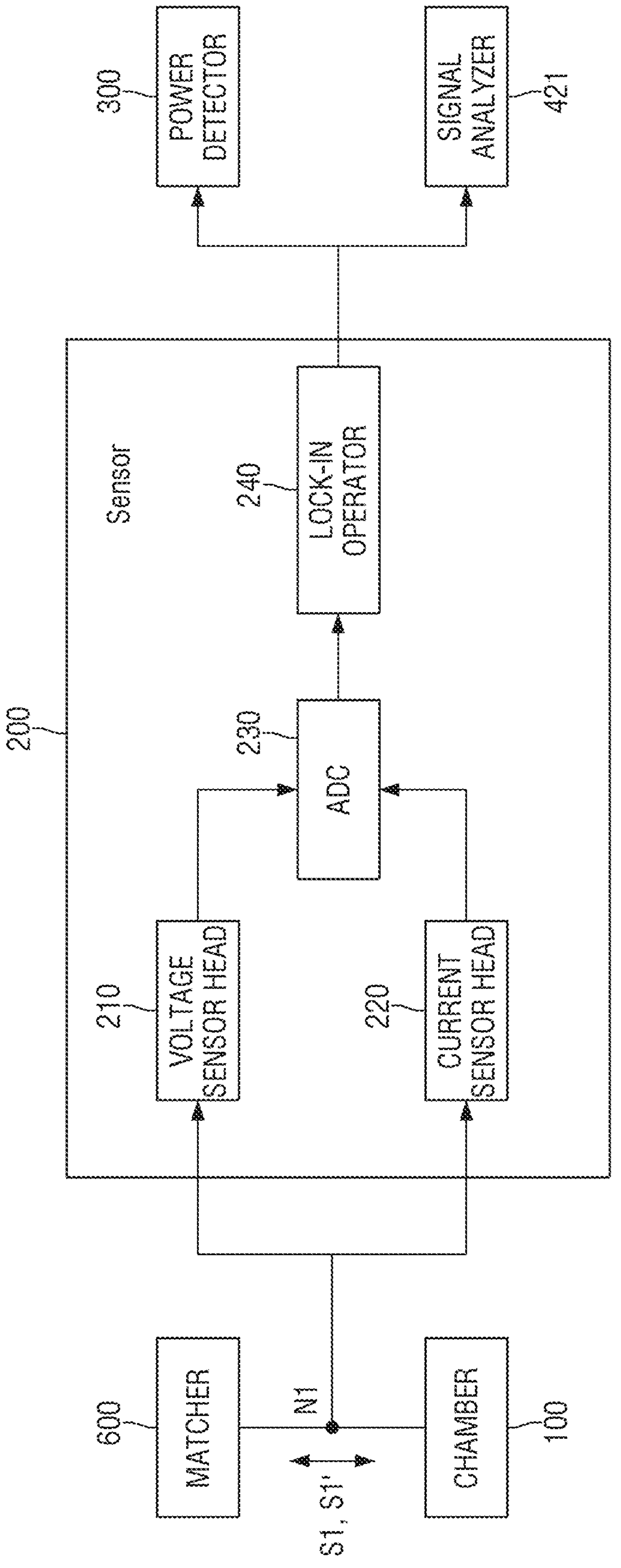
FIG. 3 is a block diagram of the sensor of FIG. 2 according to some example embodiments.

FIG. 3 is a block diagram of the sensor of FIG. 2 according to some example embodiments.

Referring to FIG. 3, the sensor 200 may include a voltage sensor head 210 and a current sensor head 220. In some example embodiment, as the voltage sensor head 210, which senses the voltages of the signals S1 and S1', and the current sensor head 220, which senses the currents of the signals S1 and S1', are provided as separate channels, the sensor 200 can separately sense the voltages and currents of the signals S1 and S1'. In some example embodiments, the sensor 200 may include an analog-to-digital converter (ADC) 230, which receives the voltages of the signals S1 and S1' from the voltage sensor head 210 and the currents of the signals S1 and S1' from the current sensor head 220 and converts the received voltages and currents into digital signals. In some example embodiments, the digital signals obtained by the ADC 230 may be provided to a lock-in operator 240.

In some example embodiments, the lock-in operator 240 may select only information regarding target signals that need to be detected and analyzed by the signal analyzer 421, from the digital signals and may provide the selected information to the signal analyzer 421 and the power detector 300. The number of target signals selected by the lock-in operator 240 may be more than 1, but example embodiments are not limited thereto. For example, the sensor 200 may provide information regarding all sensed signals, e.g., the voltages and currents of all the signals S1 and S1', to the power detector 300 and the signal analyzer 421.

In this manner, in some example embodiments, only signals (e.g., harmonic signals) that need to be controlled among the signals generated in the chamber 100 can be selectively controlled by selectively analyzing the signals that need to be controlled, generating signals based on the results of the analysis, and providing the generated signals to the chamber 100.

Figure 4:
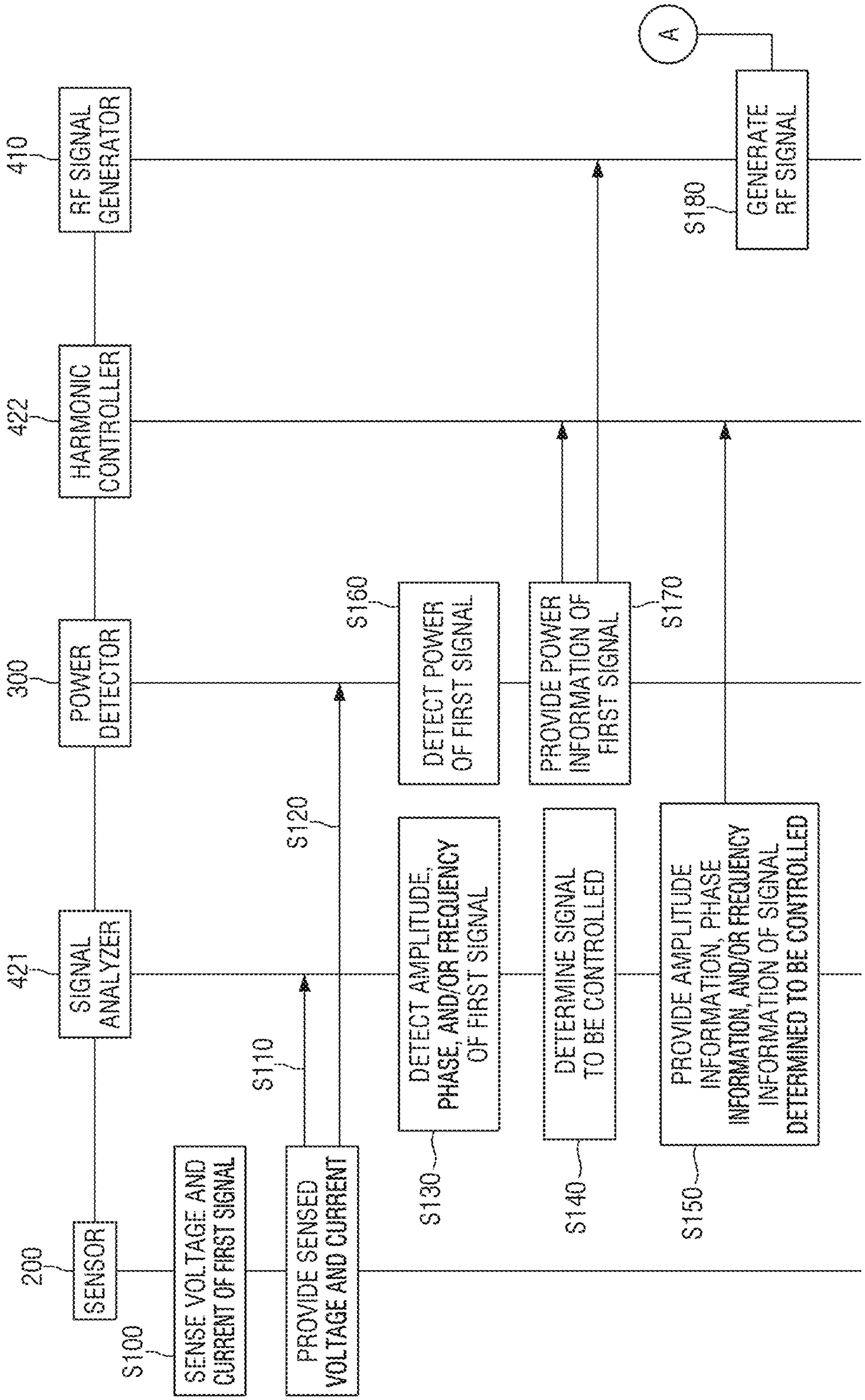
FIGS. 4 through 6 are flowcharts illustrating an operating method of the substrate processing apparatus of FIG. 1 according to some example embodiments.
Figure 5:
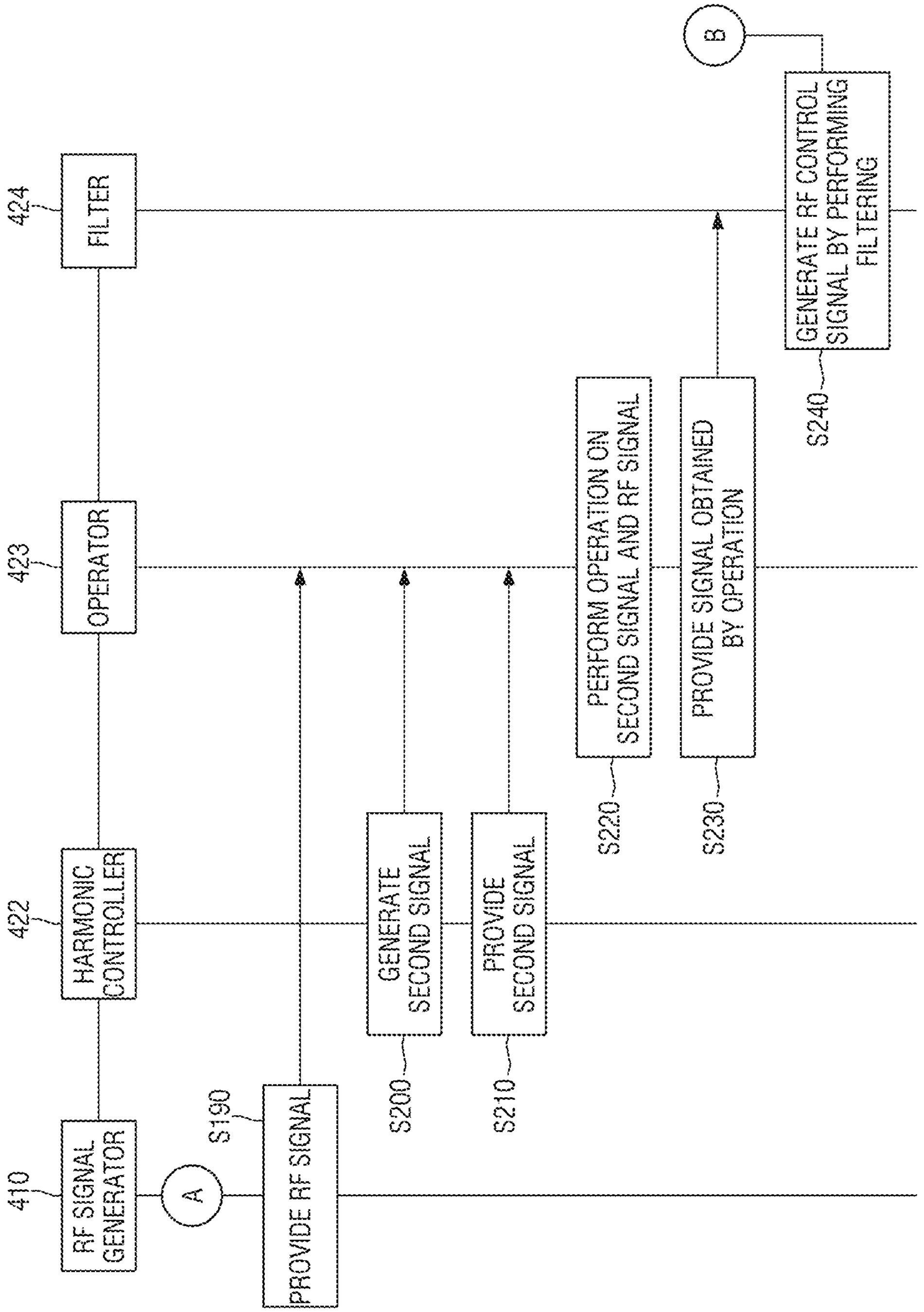
Figure 6:
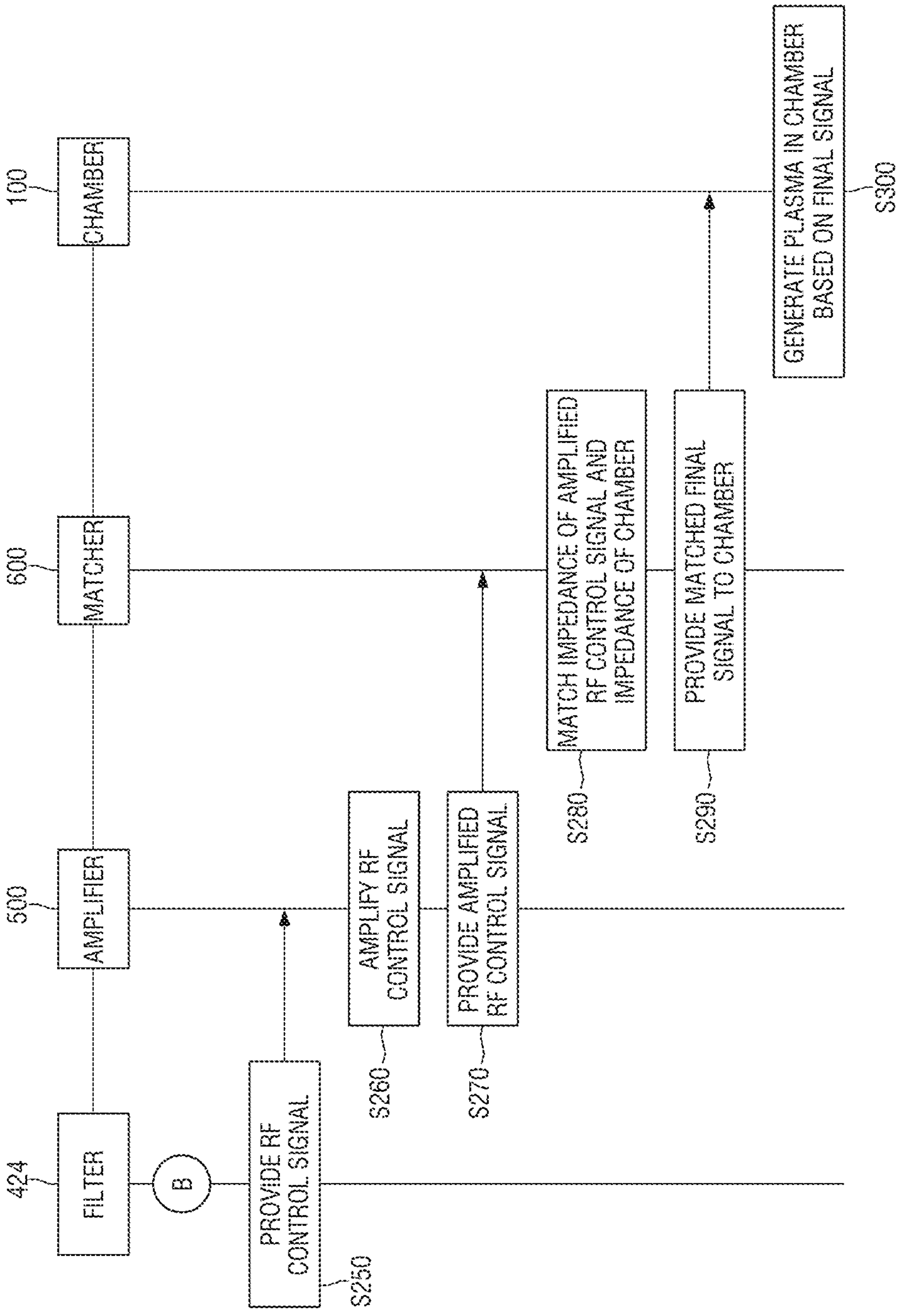

FIGS. 4 through 6 are flowcharts illustrating an operating method of the substrate processing apparatus of FIG. 1 according to some example embodiments. The operating method of the substrate apparatus of FIG. 1, according to some example embodiments, will hereinafter be described with reference to FIGS. 4 through 6 and further to FIGS. 2 and 3.

Referring to FIGS. 2 through 4, the sensor 200 may sense the voltages and currents of the signals S1 and S1' (e.g., "First Signal"), which pass through the node N1 (S100). The voltages of the signals S1 and S1', sensed by the voltage sensor head 210, and the currents of the signals S1 and S1', sensed by the current sensor head 220, may be converted into digital signals by the ADC 230, and the digital signals may be provided to the lock-in operator 240. Thereafter, the lock-in operator 240 may select digital signals regarding the voltages and currents of target signals from among all the digital signals provided by the lock-in operator 240, but example embodiments are not limited thereto. Alternatively, the digital signals provided by the lock-in operator 240 may be provided directly to the signal analyzer 421 and the power detector 300, rather than through the lock-in operator 240. All the signals S1 and S1' sensed by the sensor 200 will hereinafter be described as being provided to the signal analyzer 421 and the power detector 300.

Thereafter, the sensor 200 may provide the voltages and currents of the signals S1 and S1' to the signal analyzer 421 (S110). The sensor 200 may provide the voltages and currents of the signals S1 and S1' to the power detector 300 (S120). The provision of the voltages and currents of the signals S1 and S1' to the signal analyzer 421 and the provision of the voltages and currents of the signals S1 and S1' to the power detector 300 may be performed at the same time or at an interval of a predetermined amount of time.

Thereafter, the signal analyzer 421 may detect at least one of the amplitude, phase, and frequency of each of the signals S1 and S1' (S130) based on the voltages and currents of the signals S1 and S1', received from the sensor 200, and may analyze and/or determine one of the signals S1 and S1' as a signal to be controlled by the harmonic controller 422, based on detected information of the signals S1 and S1' (S140). Thereafter, the signal analyzer 421 may provide at least one of the amplitude, phase, and frequency of the signal determined to be controlled (S150). A signal that is determined to be controlled by the harmonic controller 422 will hereinafter be described as being, for example, one of harmonic signals generated in the chamber 100.

The power detector 300 may detect the powers of the signals S1 and S1' (S160) based on the voltages and currents of the signals S1 and S1', received from the sensor 200. Thereafter, the power detector 300 may provide detected power information of the signals S1 and S1' to the harmonic controller 422 and the RF signal generator 410 (S170). The power detector 300 may provide power information of the signal that is determined to be controlled to the harmonic controller 422. S130, S140, and S150 performed by the signal analyzer 421 and S160 and S170 performed by the power detector 300 may be performed at the same time or at intervals of a predetermined amount of time. Thereafter, the RF signal generator 410 may generate an RF signal with a natural frequency (S180) based on the power information of the signals S1 and S1', received from the power detector 300.

Thereafter, referring to FIGS. 2 and 5, in some example embodiments, the RF signal generator 410 may provide the generated RF signal to the operator 423 (S190). The harmonic controller 422 may generate a signal S2 (S200) based on the power information of the signals S1 and S1', received from the power detector 300, and at least one of the amplitude, phase, and frequency of the signal determined to be controlled, received from the signal analyzer 421, and may provide the signal S2 to the operator 423 (S210). Thereafter, the operator 423 may perform an operation on the RF signal, received from the RF signal generator 410, and the signal S2, received from the harmonic controller 422 (S220) and may provide a signal obtained by the operation to the filter 424 (S230). Thereafter, the filter 424 may generate an RF control signal (S240) by performing filtering on the signal provided by the operator 423.

Thereafter, referring to FIGS. 2 and 6, in some example embodiments, the filter 424 may provide the RF control signal to the amplifier 500 (S250). The RF control signal generated by the filter 424 may be converted into an analog signal by the DAC 700 and may then be provided to the amplifier 500. Thereafter, the amplifier 500 may amplify the RF control signal provided by the DAC 700 (S260) and may provide the amplified RF control signal to the matcher 700 (S270). Thereafter, the matcher 600 may perform a matching operation (S280) such that the impedance of the amplified RF control signal and the impedance of the chamber 100 may match. Thereafter, the matcher 600 may provide a signal obtained by the matching operation to the chamber 100. The chamber 100 may generate plasma therein (S300) based on the signal provided by the matcher S300.

Figure 7:
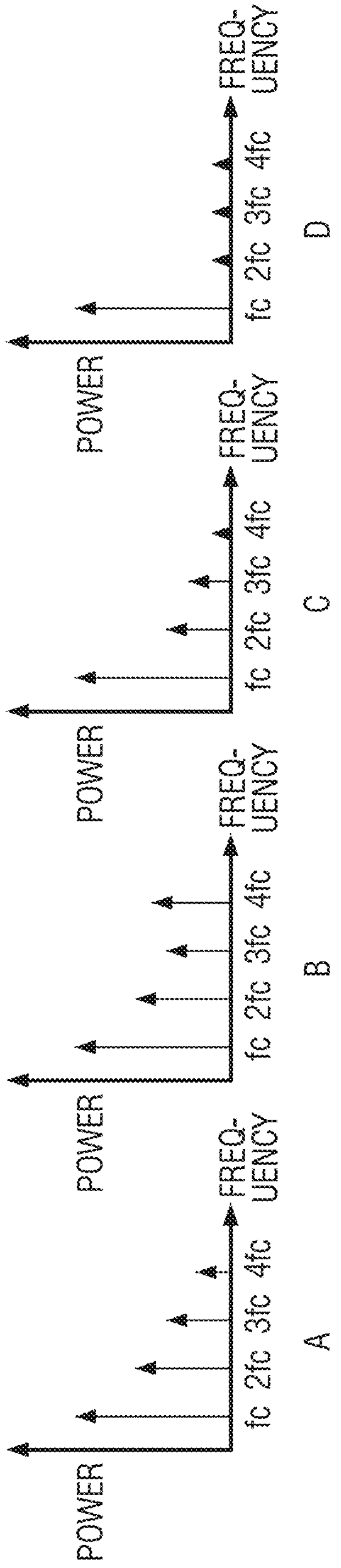
FIG. 7 shows graphs A, B, C, and D for explaining how the substrate processing apparatus of FIG. 1 controls harmonics according to some example embodiments.

FIG. 7 shows graphs A, B, C, and D for explaining how the substrate processing apparatus of FIG. 1 controls harmonics according to some example embodiments.

Referring to FIG. 7, the graph A is a frequency versus power graph showing the output of a natural frequency output signal and harmonic signals sensed by the sensor 200 according to some example embodiments, and the graphs B, C, and D are graphs for explaining harmonic injection, harmonic filtering, and harmonic cancellation according to some example embodiments. Referring to graph A of FIG. 7, the natural frequency output signal may have a first frequency of fc. Signals sensed by the sensor 200 may include first, second, and third harmonic signals having second, third, and fourth frequencies of 2fc, 3fc, and 4fc, respectively. In some example embodiments, the first, second, and third harmonic signals may have a frequency of an integer multiple of the natural frequency of the natural frequency output signal and may have a lower power than the natural frequency output signal. The higher the frequency of the harmonic signals sensed by the sensor 200, the lower the power of the harmonic signals sensed by the sensor 200. The frequencies and powers of the harmonic signals sensed by the sensor 200, shown in graph A, may be obtained by power detection and frequency detection performed by the power detector 300 and the signal analyzer 421, respectively.

In some example embodiments, graph B of FIG. 7 is a frequency versus power graph showing the output of new harmonic signals generated in the chamber 100 in accordance with harmonic control (for example, harmonic injection). Referring to graph B of FIG. 7, harmonic signals having frequencies of 2fc, 3fc, and 4fc may be new harmonic signals generated in the chamber 100 based on the signal S2, which is generated by the harmonic controller 422. The harmonic controller 422 may determine the ratio of the powers of new harmonic signals to be generated (e.g., harmonic signals having the frequencies of 2fc, 3fc, and 4fc) to the power of a natural frequency signal having a natural frequency of fc based on the powers of the signals S1 and S1', received from the power detector 300, and may generate the new harmonic signal to have power for their respective frequencies, based on amplitude, phase, and/or frequency information of the signal that is determined to be controlled.

In some example embodiments, graph C of FIG. 7 is a frequency versus power graph showing the output of new harmonic signals generated in the chamber 100 in accordance with harmonic control (for example, harmonic filtering). On graph C, like on graph B, harmonic signals having the frequencies of 2fc, 3fc, and 4fc may be new harmonic signals generated in the chamber 100 based on the signal S2, which is generated by the harmonic controller 422. Referring to graph C, new harmonic signals may be generated such that the higher the frequency, the lower the power, and the generated new harmonic signals may be provided to the chamber 100.

In some example embodiments, graph D of FIG. 7 shows how to cancel existing signals, generated in the chamber 100 and sensed by the sensor 200, via harmonic control (for example, harmonic cancellation). According to some example embodiments, in order to remove harmonics generated in the chamber 100 due to the nonlinearity of plasma generated in the amplifier 500, the matcher 600, or the chamber 100, signals having the same amplitude as, and an opposite phase to, the harmonics generated in the chamber 100 may be generated, and the generated signals may be injected into the chamber 100. This type of harmonic cancellation, according to some example embodiments, will hereinafter be described with reference to FIG. 8.

Figure 8:
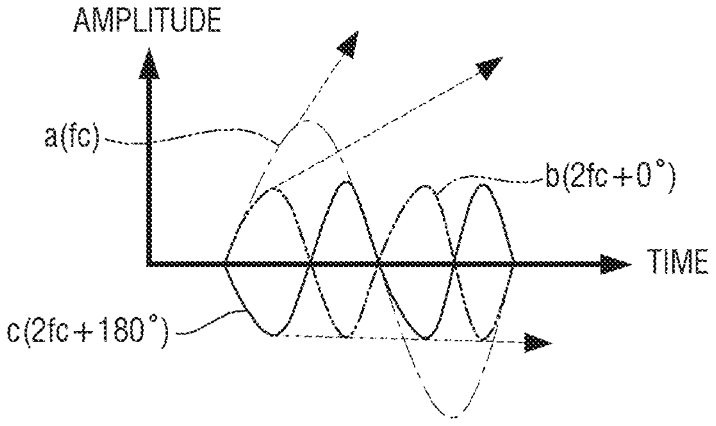
FIG. 8 is a graph for explaining the harmonic cancellation process described above with reference to FIG. 7 according to some example embodiments.

FIG. 8 is a graph for explaining the harmonic cancellation process described above with reference to FIG. 7 according to some example embodiments.

FIG. 8 shows the variation, over time, of the amplitude of signals a, b, and c sensed by the sensor 200. The signal a has a natural frequency of fc. The signal b has a frequency of twice the natural frequency of the signal a, e.g., 2fc, and has the same phase as the signal a. In some example embodiments, when the sensor 200 senses a harmonic signal such as signal b, the harmonic controller 422 may generate a signal having the same amplitude and frequency as, and having a phase difference of 180 degrees with, the signal b, e.g., the signal c. Thereafter, the RF signal generator 410 may provide an RF signal having a natural frequency of fc to the operator 423, and the harmonic controller 422 may provide the signal c to the operator 423. In some example embodiments, the operator 423 may perform addition on the RF signal and the signal c and may provide the result of the addition to the filter 424. In some example embodiments, the filter 424 may perform band-selective filtering to filter out all signals, except for the RF signal and the signal c, and may pass only the RF signal and the signal c therethrough. In some example embodiments, an RF control signal output from the filter 424 may be provided finally to the chamber 100 through the DAC 700, the amplifier 500, and the matcher 600. The signal c provided to the chamber 100 may offset the signal b, which is an existing harmonic signal generated in the chamber 100, and as a result, the signal b may be removed.

Figure 9:
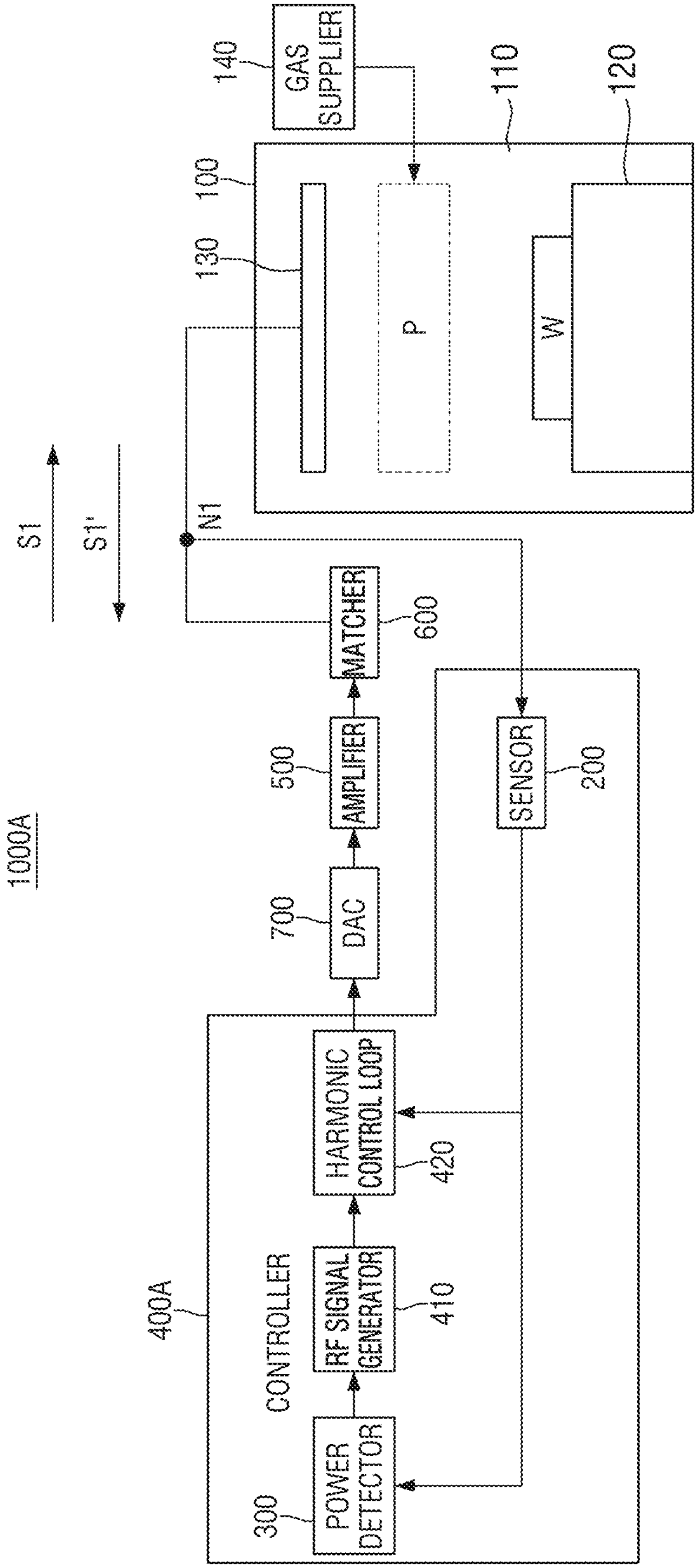
FIG. 9 is a block diagram of a substrate processing apparatus according to some example embodiments.

FIG. 9 is a block diagram of a substrate processing apparatus according to some example embodiments.

Referring to FIG. 9, a controller 400A of a substrate processing apparatus 1000A, unlike the controller 400 of FIG. 1, may include a power detector 300 and a sensor 200. For example, the controller 400A may be implemented as a single hardware device including the power detector 300, the sensor 200, an RF signal generator 410, and a harmonic control loop 420, which are configured as software or firmware, but example embodiments are not limited thereto. For example, each of the controller 400A, power detector 300, sensor 200, RF signal generator 410, and the harmonic control loop 420 may be implemented as processing circuitry or respective processing circuitries such as hardware (e.g., logic circuits) or a combination of hardware and software (e.g., a computer based electronic system like a processor executing instruction codes or program routines (e.g., a software program)). The instruction codes or the program routines may be stored in any storage device or memory device located inside or outside the computer-based electronic system.

Figure 10:
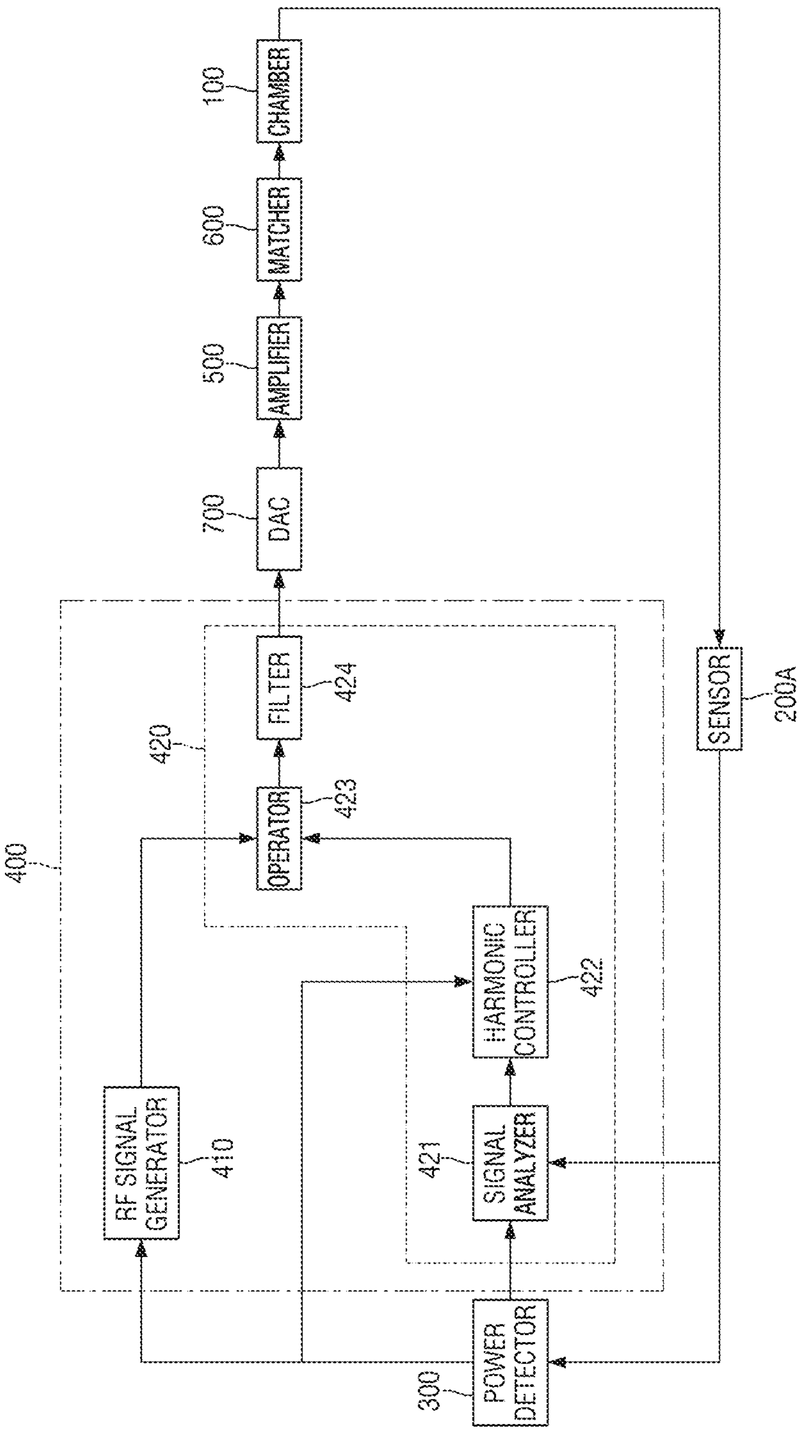
FIG. 10 is a block diagram of a substrate processing apparatus according to some example embodiments.

FIG. 10 is a block diagram of a substrate processing apparatus according to some example embodiments.

Referring to FIG. 10, in some example embodiments, a sensor 200A of a substrate processing apparatus 1000B, unlike the sensor 200 of FIG. 2, may be connected to an output port of chamber 100. In some example embodiments, the sensor 200A may be connected to a view port, which is formed on a side of the chamber 100, and may thus be able to sense signals (including, for example, harmonics) generated in the chamber 100, in real time, when a process is being performed in the chamber 100. Also, in some example embodiments, the sensor 200A may be able to sense various harmonics generated due to the nonlinearity of plasma in the chamber 100.

Figure 11:
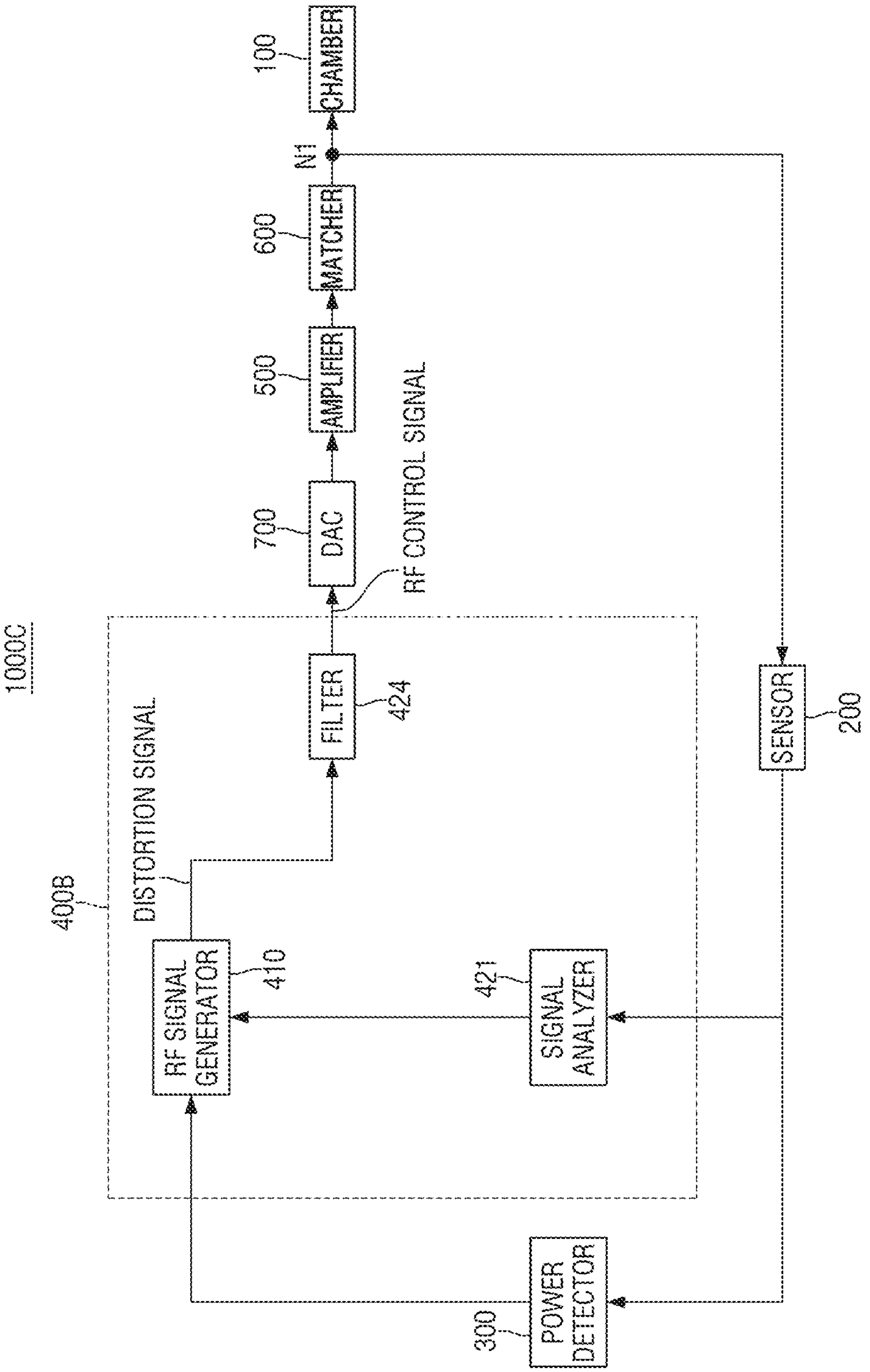
FIG. 11 is a block diagram of a substrate processing apparatus according to some example embodiments.

FIG. 11 is a block diagram of a substrate processing apparatus according to some example embodiments. The embodiment embodiments, illustrated in, for example, FIG. 11 will hereinafter be described, focusing mainly on the differences with the previous example embodiments.

Referring to FIG. 11, in some example embodiments, a substrate processing apparatus 1000C may include a chamber 100, a sensor 200, a power detector 300, a controller 400B, an amplifier 500, and a matcher 600. The controller 400B may include a signal analyzer 421, an RF signal generator 410, and a filter 424. The sensor 200 and the power detector 300 may be included in the controller 400B. The substrate processing apparatus 100C may not include the power detector 300.

In some example embodiments, the signal analyzer 421 may receive the voltages and currents of signals S1 and S1', which pass through a node N1, from the sensor 200. The signal analyzer 421 may detect at least one of the amplitude, phase, and frequency of each of the signals S1 and S1' and may analyze and/or determine one of the signals S1 and S1' as a signal that is to be controlled. In some example embodiments, the signal analyzer 421 may provide detected information of the signal that is to be controlled, for example the signal analyzer 421 may provide detected information of the signal that is to be controlled to the RF signal generator 410.

In some example embodiments, the RF signal generator 410 may generate a distortion signal based on the information received from the signal analyzer 421. The distortion signal may be generated by pre-distorting the amplitude and phase of an RF signal with a natural frequency, generated by the RF signal generator 410. In some example embodiments, the RF signal generator 410 may generate the RF signal in a digital manner, in which case, the distortion signal may be generated by a memory- or memoryless digital predistortion (DPD) method.

In some example embodiments, the power detector 300 may receive the voltages and currents of the signals S1 and S1' from the sensor 200. The power detector 300 may detect the powers of the signals S1 and S1' and may provide detected power information of the signals S1 and S1' to the RF signal generator 410. The RF signal generator 410 may generate the distortion signal based on the power information of the signals S1 and S1', received from the power detector 300.

Figure 12:
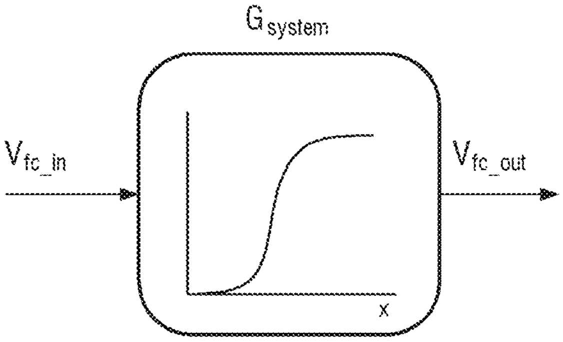
FIGS. 12 through 14 are graphs for explaining harmonic predistortion performed by the substrate processing apparatus 1000C of FIG. 11 according to some example embodiments.
Figure 13:
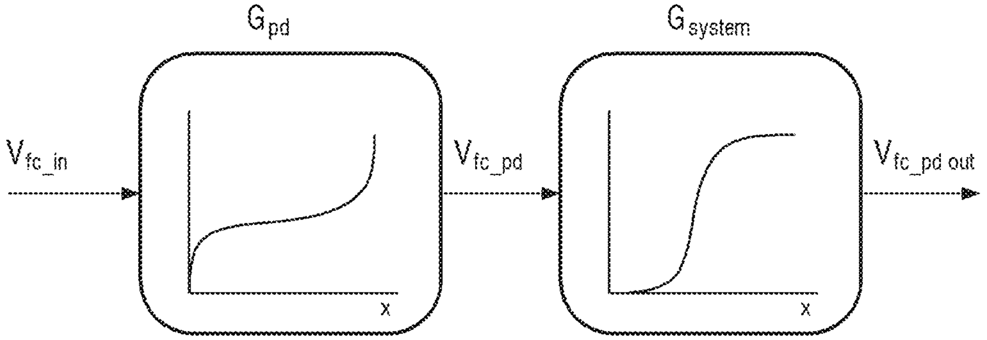
Figure 14:
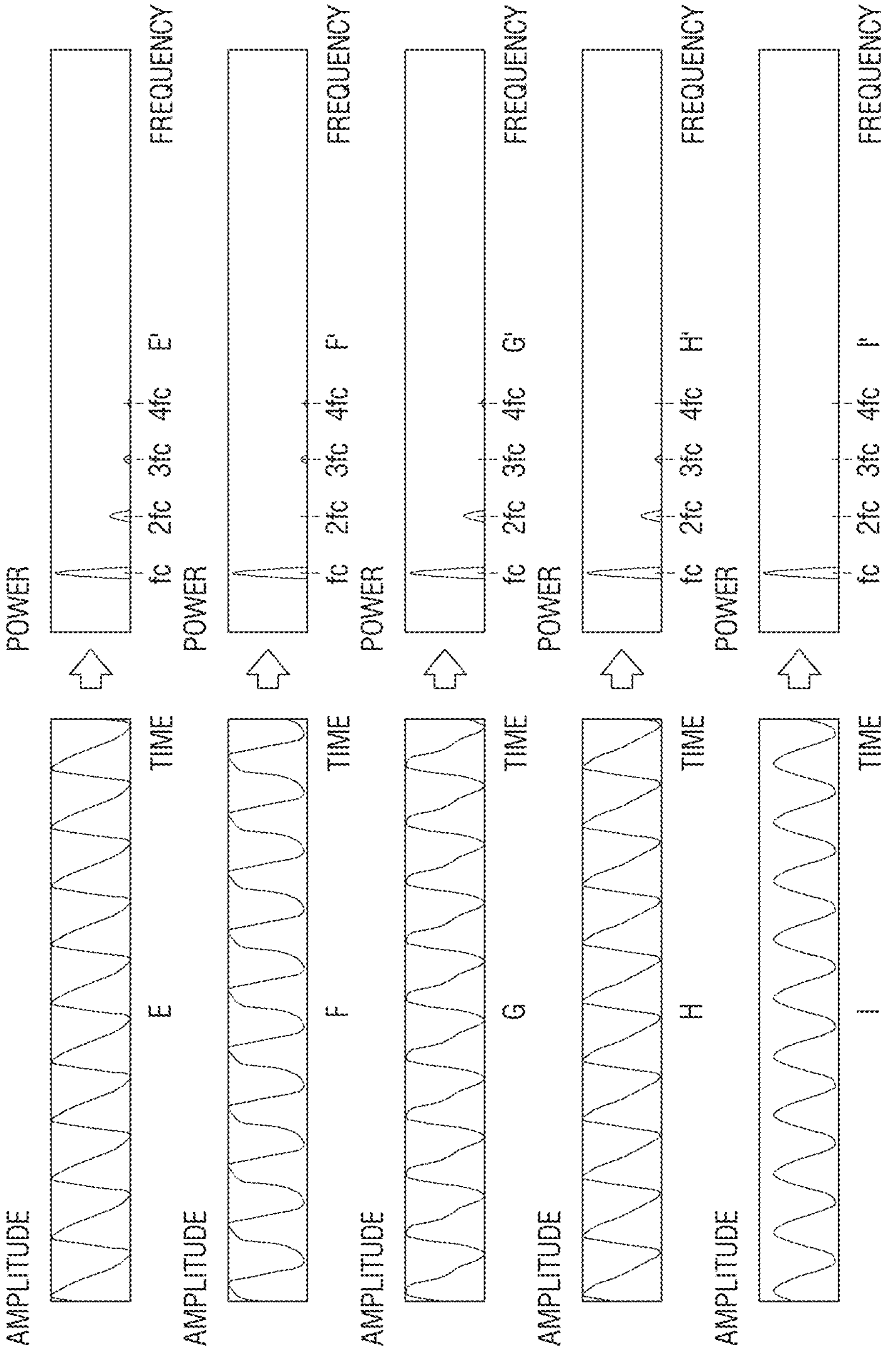

FIGS. 12 through 14 are graphs for explaining harmonic predistortion performed by the substrate processing apparatus 1000C of FIG. 11 according to some example embodiments.

FIG. 12 is a graph showing the nonlinear response characteristic of the elements of the substrate processing apparatus 1000C of FIG. 1 according to some example embodiments. Referring to FIG. 12, $G_{system}$ refers to an element of the substrate processing apparatus 1000C that has a nonlinear response characteristic. For example, the nonlinear element $G_{system}$ may be any one of the amplifier 500, the matcher 600, and the chamber 100 or the combination of any two of the amplifier 500, the matcher 600, and the chamber 100. Referring to FIG. 12, $V_{fc\_in}$ refers to an input signal with a natural frequency, $V_{fc\_out}$ refers to an output signal obtained by passing the input signal $V_{fc\_in}$ through the nonlinear element $G_{system}$. The nonlinear element $G_{system}$, the input signal $V_{fc\_in}$, and the output signal $V_{fc\_out}$ may be defined by Equations (1), (2), and (3):

$$G_{system} = a + bx + cx^2; \tag{1}$$

$$V_{fc\_in} = A\cos(wt),\ w = 2\pi \cdot fc \cdot tl; \tag{2}$$

$$\text{and } V_{fc\_out} = a + b \cdot V_{fc\_in} + c \cdot V_{fc\_in}^2 + d \cdot V_{fc\_in}^3 = a + cA^2/2 + b \cdot \cos(wt) + (3dA^3/4)\cos(wt) + (cA^2/2) \cdot \cos(2wt) + (3dA^3/4) \cdot \cos(3wt). \tag{3}$$

Referring to Equation (3), the output signal $V_{fc\_out}$, which is finally output through the nonlinear element $G_{system}$, may be expressed as the sum of $(a+b \cdot V_{fc\_in})$, which is a direct current (DC) component, $(b \cdot \cos(wt)+(3dA^3/4)\cos(wt))$, which is a natural frequency component, $(cA^2/2) \cdot \cos(2wt)$, which is a harmonic component, and $(3dA^3/4) \cdot \cos(3wt)$, which is another harmonic component. Due to the nonlinear response characteristic of the nonlinear element $G_{system}$, harmonic components having a frequency of an integer multiple of a natural frequency can be generated.

FIG. 13 is a graph for explaining how to convert the nonlinear response characteristic of the nonlinear element $G_{system}$ of FIG. 12 into a linear signal via predistortion according to some example embodiments. Referring to FIG. 13, $G_{pd}$ refers to an inverse function of the nonlinear element $G_{system}$, $V_{fc\_pd}$ refers to a distortion signal obtained by pre-distorting the input signal $V_{fc\_in}$ with a natural frequency, and the distortion signal $V_{fc\_pd}$ may be generated by the RF signal generator 410. $V_{fc_pd_}$out refers to an output signal obtained by passing the distortion signal $V_{fc\_pd}$ through the nonlinear element $G_{system}$. The distortion signal $V_{fc\_pd}$ and the output signal $V_{fc_pd_}$out may be defined by Equations (4) and (5):

$$V_{fc\_pd} = G^{-1}(V_{fc\_in}); \tag{4}$$

$$V_{fc\_pd\_out} = k \cdot G(V_{fc\_pd}) = k \cdot G^{-1}(G(V_{fc\_in})) = k1 + k2 \cdot \cos(wt). \tag{5}$$

Referring to Equation (5), the output signal $V_{fc_pd_}$out, which if finally output via $G_{pd}$ and $G_{system}$, for example, which is finally output via predistortion $G_{pd}$, e.g., via the inverse function of the nonlinear element $G_{system}$, before passing through the nonlinear element $G_{system}$, may be a signal with a linear characteristic and consisting only of k1, which is a DC component, and k2·cos(wt), which is a natural frequency component.

In this manner, in some example embodiments, the generation of harmonic signals can be completely prevented by extracting a nonlinear response characteristic of a nonlinear element to be passed through by an RF signal, which is for a plasma source supplying RF power to the chamber 100, at the stage of generating the RF signal and generating a distortion signal using the inverse function of the extracted nonlinear response characteristic.

FIG. 14 shows graphs for explaining how to remove harmonics generated in the chamber 100 of FIG. 11 via predistortion according to some example embodiments. Referring to FIGS. 11 and 14, graph E is an amplitude versus time graph showing the output of a signal into which signals sensed by the sensor 200, e.g., a natural frequency signal having a first frequency of fc, a first harmonic signal having a second frequency of 2fc, a second harmonic signal having a third frequency of 3fc, and a third harmonic signal having a fourth frequency of 4fc, are mixed, and graph E' is a frequency versus power graph showing the output of the natural frequency signal and the first, second, and third harmonic signals of the graph E.

Graph F is an amplitude versus time graph showing the output of a signal obtained by inserting a distortion signal from the first harmonic signal having the second frequency of 2fc into the signal of the graph E. Graph F' is a frequency versus power graph showing the output of the signal of the graph F. Referring to graph F', the natural frequency signal having the first frequency of fc, the second harmonic signal having the third frequency of 3fc, and the third harmonic signal having the fourth frequency of 4fc are generated, but the first harmonic signal having the second frequency of 2fc is offset and is thus not generated.

Similarly, graph G shows a signal output by inserting a distortion signal from the second harmonic signal having the third frequency of 3fc into the signal of the graph E, and graph G' is a frequency versus power graph for the graph G. Referring to graph G', the second harmonic signal is offset and is thus not generated.

Similarly, graph H shows a signal output by inserting a distortion signal from the third harmonic signal having the fourth frequency of 4fc into the signal of graph E, and graph H' is a frequency versus power graph for graph H. Referring to graph H', the third harmonic signal is offset and is thus not generated.

Graph I shows a case where three distortion signals from the first, second, and third harmonic signals are inserted into the signal of graph E, and graph I' is a frequency versus power graph for graph I. Referring to graph I', the generation of all harmonic signals except for the natural frequency signal can be completely prevented.

Figure 15:
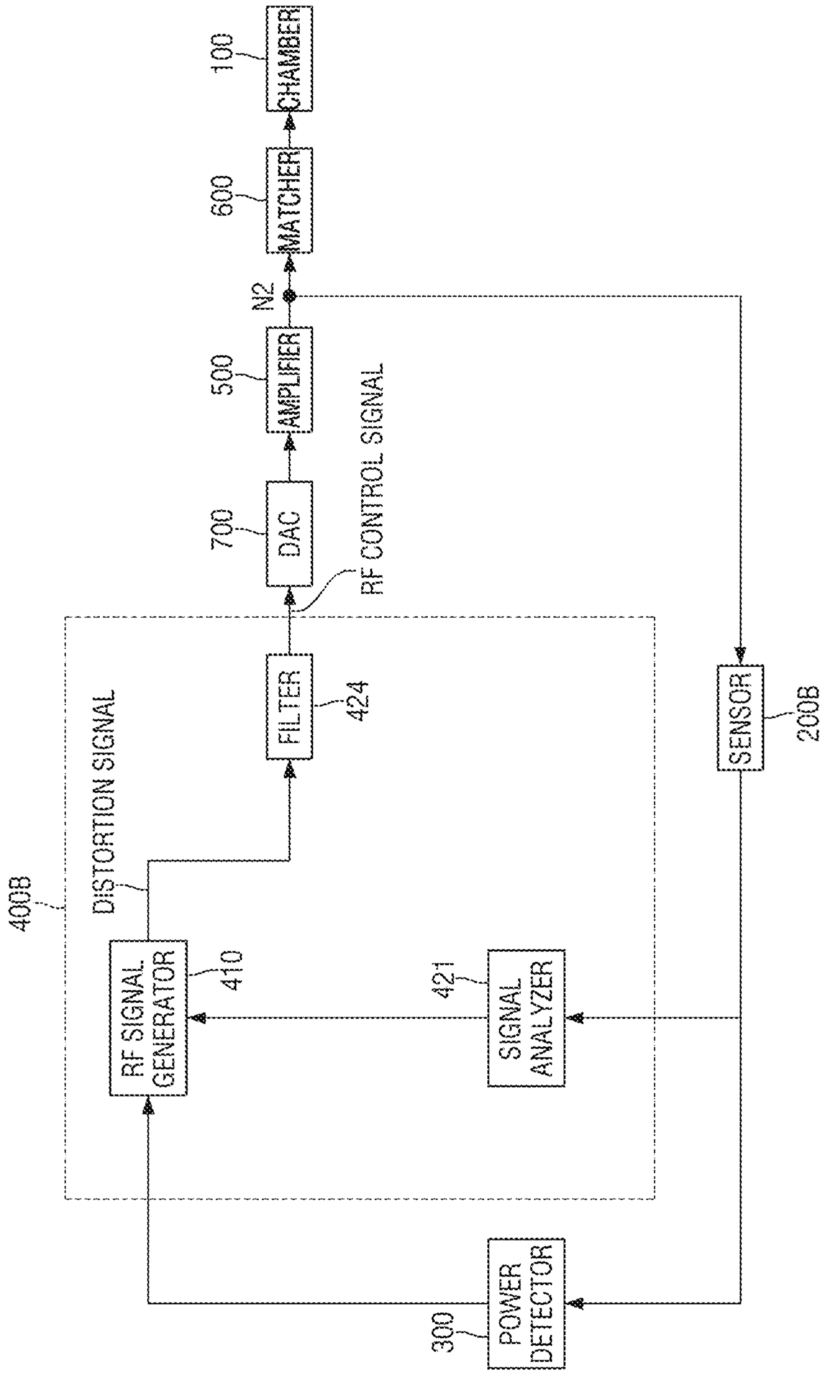
FIG. 15 is a block diagram of a substrate processing apparatus according to some example embodiments.

FIG. 15 is a block diagram of a substrate processing apparatus according to some example embodiments.

Referring to FIG. 15, in some example embodiments, a sensor 200B of a substrate processing apparatus 1000D, unlike the sensor 200 of FIG. 11, may be connected to a node N2 between an amplifier 500 and a matcher 600 and may thus be able to sense the voltages and currents of signals input from the amplifier 500 to the matcher 600. Accordingly, in some example embodiment, an RF signal generator 410 can generate distortion signals based on the nonlinear response characteristic of the amplifier 500.

Figure 16:
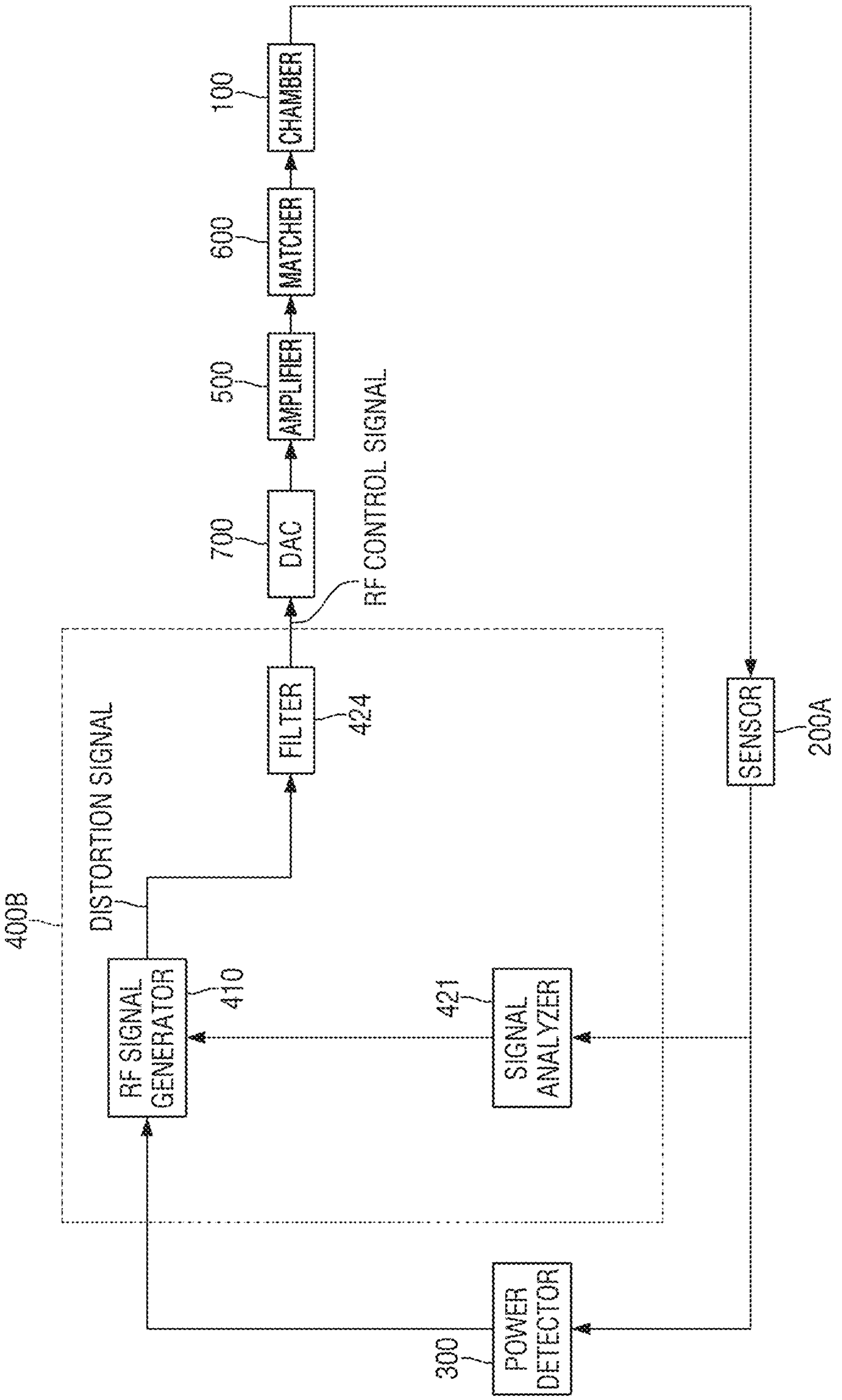
FIG. 16 is a block diagram of a substrate processing apparatus according to some example embodiments.

FIG. 16 is a block diagram of a substrate processing apparatus according to some example embodiments.

Referring to FIG. 16, in some example embodiments, a sensor 200A of a substrate processing apparatus 1000E, unlike the sensor 200 or 200B of FIG. 11 or 15, may be connected to an output port of a chamber 100. The sensor 200A may be connected to a view port, which is formed on a side of the chamber 100, and may thus be able to sense signals (including harmonics) generated in the chamber 100, in real time, when a process is being performed in the chamber 100. Also, in some example embodiments, the sensor 200A may be able to sense various harmonics generated due to the nonlinearity of plasma in the chamber 100. Accordingly, an RF signal generator 410 can generate distortion signals based not only on the nonlinear response characteristic of the amplifier 500 and the matcher 600, but also on the nonlinear response characteristic of plasma in the chamber 100.

While the inventive concepts have been illustrated and described with reference to some example embodiments thereof, it will be understood by those of ordinary skill in the art that various changes in form and detail may be made therein without departing from the spirit and scope of the present disclosure as defined by the following claims.

What is claimed is:

1. A substrate processing apparatus comprising:

a signal analyzer configured to detect at least one of an amplitude, phase, and frequency of a first signal, which is provided to a chamber;

a radio frequency (RF) signal generator configured to generate an RF signal with a natural frequency based on a power of the first signal;

a harmonic controller configured to generate a second signal based on the power of the first signal and at least one of the amplitude, phase, and frequency of the first signal, the second signal having a different amplitude, a different phase, and/or a different frequency from the RF signal;

an operator configured to perform an operation on the RF signal and the second signal; and a filter configured to generate an RF control signal by filtering an output signal of the operator.

2. The substrate processing apparatus of claim 1, further comprising:

a power detector configured to detect the power of the first signal, wherein the RF signal generator and the harmonic controller receive the detected power of the first signal from the power detector.

3. The substrate processing apparatus of claim 1, further comprising:

a sensor configured to sense a voltage and current of the first signal, wherein the sensed voltage and current are provided to a power detector and the signal analyzer.

4. The substrate processing apparatus of claim 3, wherein the sensor includes a voltage sensor head configured to sense the voltage of the first signal, and a current sensor head configured to sense the current of the first signal.

5. The substrate processing apparatus of claim 4, wherein the sensor includes an analog-to-digital converter (ADC) configured to receive the voltage of the first signal from the voltage sensor head and the current of the first signal from the current sensor head and configured to convert the voltage and current of the first signal into digital signals.

6. The substrate processing apparatus of claim 1, wherein the first signal includes a signal having a frequency of an integer multiple of a frequency of the RF signal.

7. The substrate processing apparatus of claim 1, wherein the filter is configured to pass the second signal, which is generated by the harmonic controller, therethrough.

8. A substrate processing apparatus comprising:

a chamber in which processes for the substrate are performed, the chamber having processing space therein;

a controller configured to generate a radio frequency (RF) control signal, which is for generating plasma in the chamber;

an amplifier connected to the controller and configured to amplify the RF control signal, output from the controller; and a matcher connected between the amplifier and the chamber and configured to match an impedance of a signal output from the amplifier and an impedance of the chamber, wherein the controller includes, a sensor connected to a node between the matcher and the chamber and configured to sense a voltage and current of a first signal passing through the node, a power detector configured to detect a power of the first signal based on the voltage and current of the first signal, received from the sensor, an RF signal generator configured to generate an RF signal with a natural frequency based on the power of the first signal, and a harmonic control loop configured to control harmonics in the chamber based on the voltage and current of the first signal, received from the sensor.

9. The substrate processing apparatus of claim 8, wherein the harmonic control loop includes a signal analyzer configured to detect at least one of an amplitude, phase, and frequency of the first signal based on the voltage and current of the first signal received from the sensor.

10. The substrate processing apparatus of claim 9, wherein the signal analyzer is configured to determine which harmonics generated in the chamber are to be controlled.

11. The substrate processing apparatus of claim 9, wherein the signal analyzer is configured to detect at least one of the amplitude, phase, and frequency of the first signal using one of fast Fourier transform (FFT), lock-in amplification, and complex signal demodulation (IQ demodulation).

12. The substrate processing apparatus of claim 9, wherein the harmonic control loop further includes a harmonic controller, and the harmonic controller is configured to generate a second signal based on receiving at least one of amplitude information, phase information, and frequency information of which harmonics to control among harmonics generated in the chamber from the signal analyzer, and based on receiving power information of the first signal from the power detector.

13. The substrate processing apparatus of claim 12, wherein the second signal is obtained by converting at least one of the amplitude, phase, and frequency of the first signal.

14. The substrate processing apparatus of claim 12, wherein the second signal has a same phase as, and a greater amplitude than a harmonic signal to be controlled.

15. The substrate processing apparatus of claim 12, wherein the second signal has a same amplitude as, and an opposite phase to, a harmonic signal that to be controlled.

16. The substrate processing apparatus of claim 12, wherein the harmonic control loop further includes an operator configured to perform an operation on the RF signal and the second signal.

17. The substrate processing apparatus of claim 16, wherein the harmonic control loop further includes a filter, which is configured to generate the RF control signal by filtering an output signal of the operator.

18. The substrate processing apparatus of claim 8, wherein the harmonics are generated in the chamber due to nonlinearity of at least one of the amplifier, the matcher, and the chamber.

19. A substrate processing apparatus comprising:

a chamber in which processes for the substrate are performed, the chamber having processing space therein;

a controller configured to generate a radio frequency (RF) control signal, which is for generating plasma in the chamber;

an amplifier connected to the controller and configured to amplify the RF control signal, output from the controller; and a matcher connected between the amplifier and the chamber and configured to match a first impedance of a signal output from the amplifier and a second impedance of the chamber, wherein the controller includes, a sensor connected to a node between the matcher and the chamber and configured to sense a voltage and current of a first signal passing through the node, a signal analyzer configured to detect at least one of an amplitude, phase, and frequency of the first signal based on the voltage and current of the first signal, received from the sensor, and the signal analyzer configured to determine which of harmonics generated in the chamber to be controlled, and an RF signal generator configured to receive information of the harmonic to be controlled, from the signal analyzer and generate a distortion signal based on the received information.

20. The substrate processing apparatus of claim 19, further comprising:

a power detector configured to detect a power of the first signal based on the voltage and current of the first signal, received from the sensor.

* * * * *